(12) United States Patent
Heim et al.

(10) Patent No.: US 9,574,604 B2
(45) Date of Patent: Feb. 21, 2017

(54) CIRCUIT BOARD FOR CONNECTING A DEFORMATION SENSOR TO A SIGNAL-PROCESSING CIRCUIT

(71) Applicant: Schaeffler Technologies AG & Co. KG, Herzogenaurach (DE)

(72) Inventors: Jens Heim, Bergrheinfeld (DE); Jakob Schillinger, Gaimersheim (DE); Dietmar Huber, Dietzenbach (DE); Stephan Risch, Weiterstadt (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 26 days.

(21) Appl. No.: 14/764,701

(22) PCT Filed: Mar. 17, 2014

(86) PCT No.: PCT/DE2014/000133
§ 371 (c)(1),
(2) Date: Jul. 30, 2015

(87) PCT Pub. No.: WO2014/146634
PCT Pub. Date: Sep. 25, 2014

(65) Prior Publication Data
US 2015/0369279 A1    Dec. 24, 2015

(30) Foreign Application Priority Data
Mar. 19, 2013 (DE) .......................... 10 2013 004 678

(51) Int. Cl.
*F16C 19/52* (2006.01)
*G01L 5/00* (2006.01)
(Continued)

(52) U.S. Cl.
CPC ........... *F16C 19/522* (2013.01); *F16C 33/586* (2013.01); *G01L 5/0009* (2013.01); *H05K 1/18* (2013.01); *F16C 19/08* (2013.01); *G01M 13/04* (2013.01)

(58) Field of Classification Search
CPC .............................. F16C 19/522; G01L 5/0009
See application file for complete search history.

(56) References Cited

U.S. PATENT DOCUMENTS

| | | | |
|---|---|---|---|
| 6,701,780 B2 | 3/2004 | Hofmann et al. | |
| 7,568,842 B2 * | 8/2009 | Gempper | G01L 5/0019 384/448 |

(Continued)

FOREIGN PATENT DOCUMENTS

| | | |
|---|---|---|
| DE | 10164929 | 8/2010 |
| EP | 2012031 | 1/2009 |

(Continued)

Primary Examiner — Thomas R. Hannon
(74) Attorney, Agent, or Firm — Volpe and Koenig, P.C.

(57) ABSTRACT

A circuit board (4) for connecting a deformation sensor (16, 18), which is provided on a radial outer side of a rolling bearing outer ring (6), to a signal-processing circuit (28), the circuit board including—a cylindrical support plate (20) having a cylinder opening in which the rolling bearing outer ring (6) can be accommodated concentrically to said cylindrical support plate (20), —an electrical contact pad (22) on the cylindrical support plate (20) for electrical contacting with the deformation sensor (16, 18) and—an electrical strip conductor (26) which is electrically connected to the electrical contact pad (22) and is designed to receive signals from the deformation sensor (16, 18) and convey them to the signal-processing circuit (28).

10 Claims, 2 Drawing Sheets

(51) Int. Cl.
*H05K 1/18* (2006.01)
*F16C 33/58* (2006.01)
G01M 13/04 (2006.01)
F16C 19/08 (2006.01)

(56) References Cited

U.S. PATENT DOCUMENTS

| | | |
|---|---|---|
| 7,618,196 B2 | 11/2009 | Hirai et al. |
| 7,878,713 B2 * | 2/2011 | Ozaki ................. B60B 27/0005 384/448 |
| 2005/0259903 A1 * | 11/2005 | Takizawa .............. F16C 19/525 384/448 |
| 2008/0091361 A1 | 4/2008 | Pecher |

FOREIGN PATENT DOCUMENTS

| | | |
|---|---|---|
| EP | 2341327 | 7/2011 |
| JP | 2002349558 | 12/2002 |
| WO | 2005121809 | 12/2005 |
| WO | 2007125646 | 11/2007 |

* cited by examiner

CIRCUIT BOARD FOR CONNECTING A DEFORMATION SENSOR TO A SIGNAL-PROCESSING CIRCUIT

BACKGROUND

The invention relates to a circuit board for connecting a deformation sensor, which is arranged on a radially outer side of a rolling bearing outer ring, to a signal-processing circuit. The invention also relates to a wheel bearing for a vehicle with the circuit board.

From DE 101 64 929 B4 it is known to arrange deformation sensors circumferentially on a radially outer side of an outer ring of a wheel bearing, wherein these sensors detect deformation forces acting on the outer ring and indicate these forces in the form of electrically detectable signals. Based on these signals, the deformation forces on the outer ring can then be detected in all spatial directions, in order to use them, for example, for stabilizing the vehicle.

SUMMARY

The objective of the present invention is to improve the specified wheel bearing.

This objective is achieved by the features of the independent claims. Preferred improvements are the subject matter of the dependent claims.

According to one aspect of the invention, a circuit board for connecting a deformation sensor that is arranged on a radially outer side or radially inner side corresponding to a rolling bearing outer ring or rolling bearing inner ring to a signal-processing circuit
- a cylindrical carrier plate with a cylinder opening in which the rolling bearing outer ring can be held concentric to the cylindrical carrier plate or can be arranged concentric to the cylinder opening on its radially outer side of the rolling bearing inner ring viewed from the cylinder opening,
- an electrical contact pad on the cylindrical carrier plate for making electrical contact with the deformation sensor, and
- an electrical strip conductor that is connected electrically to the electrical contact pad and is designed to receive signals from the deformation sensor and forward them to the signal processing circuit.

The specified method is based on the idea that the signals that are output by the deformation sensors in the wheel bearings mentioned above have only a very low power and thus a low signal-to-noise ratio. Thus, the length that can be dimensioned for an electrical line over which these signals can be transmitted is limited. On the other hand, however, it is recognized in the scope of the specified method that even in the vehicle environment, several meters often must be covered between a sensor and a circuit that further uses the signals of the sensor for information processing. The signals mentioned above would here be lost in the background noise.

To solve this problem, it is provided in the scope of the specified method to mount a circuit board directly on the outer ring of a rolling bearing. The shape of the circuit board is adapted to the outer ring. The circuit board adapted to the shape of the outer ring allows any electrical circuit elements to be moved close to the deformation sensor, so that its signal can be used effectively and with low parasitic coupling.

The deformation sensor can be any type. For example, as surface sensors, known strain gauges or surface wave filters could be used. Surface wave filters are here components made from a piezoelectric material. This material is structured so that it has defined filter/propagation time properties. Mechanical deformation changes these filter/propagation time properties and these changes can be detected with an evaluation circuit.

The cylindrical carrier plate is used in the specified circuit board as a wiring carrier. It can be produced using any method, but should be constructed from an electrically insulating material. In an especially preferred way, the cylindrical carrier plate is an injection molded body that can be produced in an especially economical way in large scale production. The injection molding method could be a 1-component or 2-component method known to someone skilled in the art.

As the starting material for the cylindrical carrier plate, any electrically insulating material could be used. If, for example, a plastic, such as polyphenylene sulfide, called PPS, or a liquid-crystal polymer, called LCP, is selected, the cylindrical carrier plate isolates the strip conductors to be supported and other electrical components electrically from each other and further has an optimum mechanical stability to absorb, for example, vibrations acting on the outer ring and thus to protect the strip conductors to be supported and other electrical components from fatigue fracture and other mechanical damage. The cylindrical carrier plate thus not only carries the electrical wires, but also acts as a vibration damper.

According to the injection molding process named above, the cylindrical carrier plate can be coated partially with an electrically conductive surface. The surface of the carrier plate can be pretreated with known means, for example, with laser structuring, at the conductive positions to be coated, in order to support the following partial coating process. Finally, contact surfaces can be post-processed on the coated surface of the cylindrical carrier plate, in order to ensure a reliable electrical contacting, for example, with the signal preparation elements or the evaluation electronics named above. This post-processing can include a smoothing and/or surface cleaning of the contact surfaces and/or galvanizing processes. Here, the surface cleaning can be performed through plasma treatments, laser processing, wet baths, and/or known $CO_2$ jetting.

The cylinder shape of the carrier plate can be formed using any method. The cylinder shape encloses the circumference of the rolling bearing outer ring or rolling bearing inner ring, although this is not required. The two ends of the carrier plate viewed in the circumferential direction can also be held together with retaining elements, such as bridges or clips. On the inner side of the rolling bearing inner ring, the carrier plate does not have to be closed in the circumferential direction in order to guarantee mechanical stability.

The cylinder shape is to be formed in the scope of the present invention such that the carrier plate surrounds the rolling bearing outer ring in the circumferential direction or runs on the inner side of the rolling bearing inner ring in the circumferential direction.

It is not significant whether the specified carrier plate is finally mounted on a rolling bearing inner ring or a rolling bearing outer ring or optionally on a shaft or an axle in order to measure the forces applied to the shaft or axle. If the specified carrier plate can be mounted on a rolling bearing outer ring, it can also be mounted on a shaft.

In one refinement, the specified carrier plate comprises at least one part of the signal processing circuit that is carried on the carrier plate. This part can be, for example, signal processing elements that can be used to process the signal from the deformation sensor for further transmission over a long distance. Complete evaluation electronics that output a measurement signal that can be interpreted and sent to a higher circuit level, for example, an engine controller for an internal combustion engine of a vehicle. In this way, the signal to noise ratio of the signal from the deformation sensor mentioned above can be increased and the quality of the signal can be improved.

In another refinement of the specified carrier plate, the contact pad and the strip conductors are arranged on a radial outer side of the cylindrical carrier plate. In this way, the carrier plate can be equipped with parts of the signal processing circuit regardless of whether it is first mounted on the outer ring of the rolling bearing, because the radial outer side of the cylindrical carrier plate remains accessible after its placement on the outer ring.

In another refinement, the specified carrier plate comprises a radial passage opening through the cylindrical carrier plate for guiding an electrical line that electrically connects the deformation sensor to the contact pad. The radial passage opening allows, first, the deformation sensor to be formed on or attached to the outer ring of the rolling bearing, the cylindrical carrier plate to then be pushed onto the outer ring, and finally the deformation sensor to be electrically contacted with a tool, for example, a bonding tool, to the electrical strip conductor on the cylindrical carrier plate.

For the electrical contacting, techniques such as wire bonds, flexible conductive films, or taped automatic bonding, called TAB, can be used.

In one special refinement, the specified carrier plate comprises a sleeve in which the cylindrical carrier plate can be held concentrically. The sleeve is used in the special refinement as a shield for the cylindrical carrier plate and for the electrical circuit formed on it against mechanical and/or electrical environmental effects, such as mechanical contamination and/or electromagnetic interference, and thus can improve, for example, the mechanical stability and/or electromagnetic compatibility, called EMC, of the cylindrical carrier plate. For this purpose, the sleeve is produced in an especially preferred way from a conductive material with a high mechanical strength, for example, a metal. The sleeve can have any construction, for example, a grating or a homogeneous metal wall and/or can be axially open or axially closed.

In one preferred refinement, a filler material is at least partially received radially between the carrier plate and the sleeve, especially in the area of the electrical contact positions on the cylindrical carrier plate and the deformation sensor. The filler material surrounds the electrical components, for example, the electrical connections between the deformation sensor and the electrical circuit on the cylindrical carrier plate, protects these parts from environmental influences, and is used as mechanical damping against vibrations. In addition, the sleeve can be supported on the carrier plate. The filler material here can be a silicone gel, called SilGel, which can be adapted to the shape of the radial intermediate space between the cylindrical carrier plate and the sleeve, so that it can be introduced into this radial intermediate space at any moment during the production of the specified carrier plate.

In another refinement, the specified carrier plate comprises at least two support elements on the cylindrical carrier plate that are directed radially inward on a radial inner side of the cylindrical carrier plate. The support elements stabilize the mechanical retention of the cylindrical carrier plate on the outer ring, but hold the cylindrical carrier plate at a radial distance to this ring and ensure that the deformation sensor is not contacted and thus damaged by the cylindrical carrier plate.

In a special refinement, the specified carrier plate comprises a third support element on the cylindrical carrier plate that is directed radially inward on a radial inner side of the cylindrical carrier plate and has a radial shorter construction than the two other support elements. The deformation sensor can be arranged axially between this third support element and one of the two other support elements, wherein the radial passage opening named above can then be formed at this position accordingly. Viewed in an axial shifting direction of the cylindrical carrier plate onto the outer ring, the radially shorter of the two support elements can be mounted before the radially longer of the two support elements. In this way, the radially shorter support element can be pushed in the radial direction past the deformation sensor, without damaging it. In the state pushed onto the outer ring, the radially shorter support element is then supported for electrical connection of the deformation sensor to the electrical circuit on the cylindrical carrier plate or the cylindrical carrier plate is supported radially in the event of other mechanical loads and these mechanical loads are further reduced.

In one especially preferred refinement of the specified carrier plate, the cylindrical carrier plate comprises another, fourth support element that is formed radially between the cylindrical carrier plate and the sleeve, in order to stabilize the sleeve mechanically and to prevent vibrations in this part.

According to another aspect of the invention, a wheel bearing for a vehicle comprises an inner ring that is supported by rolling elements so that it can rotate in an outer ring, a deformation sensor that is arranged on a radial outer side of the outer ring, and one of the specified carrier plates for the electrical connection of the deformation sensor to the signal processing circuit.

In one refinement, the specified wheel bearing comprises another deformation sensor on the radial outer side of the outer ring that is arranged at an axial distance from the deformation sensor and on a radical step of the outer ring opposite the deformation sensor, wherein the cylindrical carrier plate has a correspondingly stepped construction. If the cylindrical carrier plate is pushed onto the outer ring in the way described above, the stepped construction of the outer ring and the cylindrical carrier plate prevent the carrier plate from mechanically contacting and damaging one of the deformation sensors.

In one especially preferred refinement of the specified wheel bearing, the outer ring comprises a radially outward projecting flange for attaching to a suspension strut of a vehicle on which the cylindrical carrier plate forms an axial contact. In other words, the deformation sensor is attached locked in rotation to the vehicle and thus deformations of the outer ring can be determined with a fixed position relative to the vehicle.

The wheel bearing itself can be any wheel bearing of second generation or above. For background information, see the text book by Bernd Heißing, "Fahrwerkhandbuch [Handbook on Chassis]," $3^{rd}$ edition, Vieweg+Teubner Verlag, 2011, ISBN 978-3-8348-0821-9.

BRIEF DESCRIPTION OF THE DRAWINGS

The properties, characteristics, and advantages of this invention described above, as well as the way these are realized, will become clear and more understandable in connection with the following description of the embodiments that will be explained in more detail in connection with the drawings, wherein.

DETAILED DESCRIPTION OF THE PREFERRED EMBODIMENTS

In the figures, identical technical elements are provided with identical reference symbols and are described only once.

Figure 1:
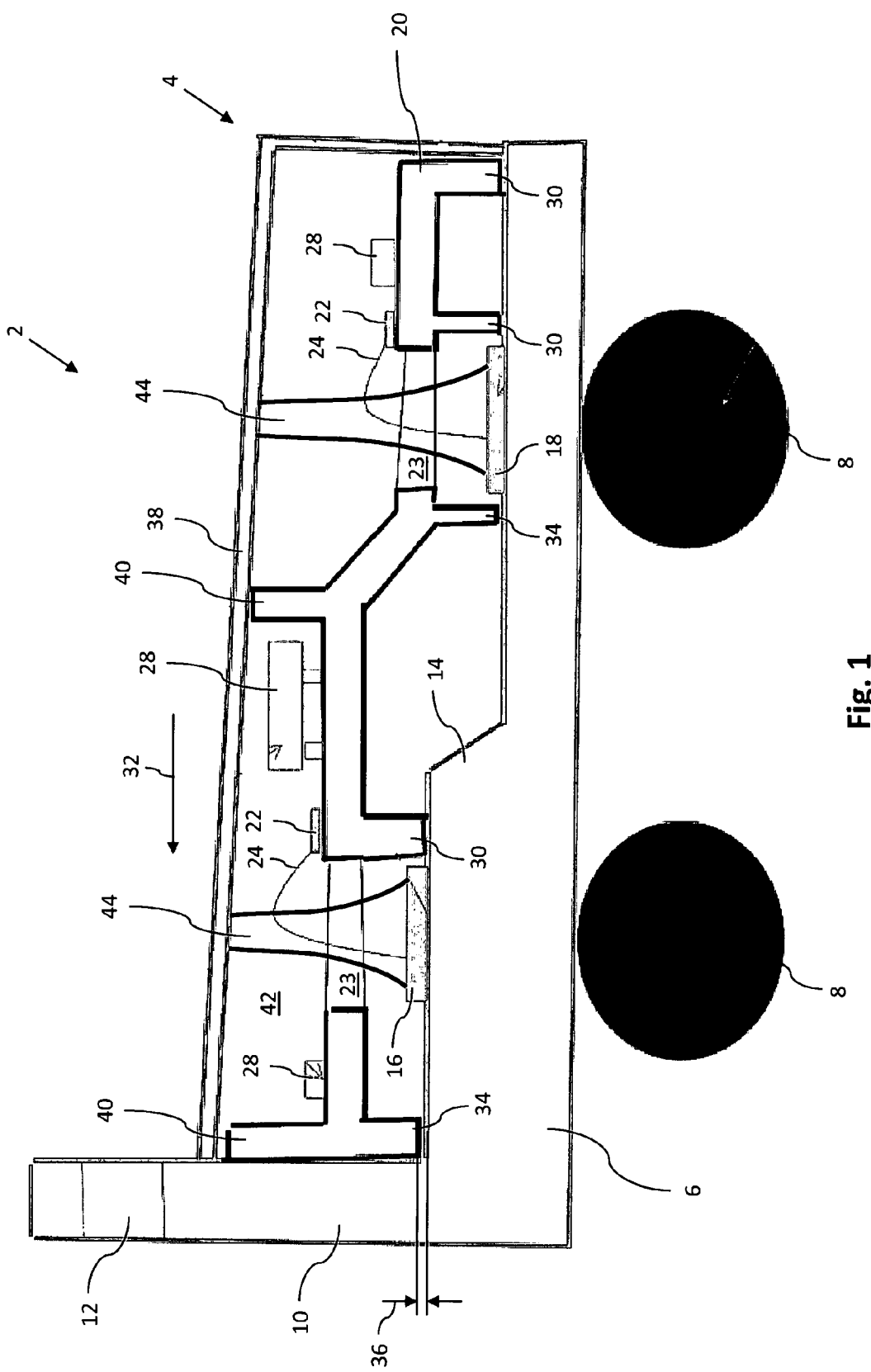
FIG. 1 shows a schematic diagram of a part of a wheel bearing with a specified circuit board.

Referring to FIG. 1, a schematic representation of a part of a wheel bearing 2 with a specified circuit board 4 in a section view in the circumferential direction is shown.

The wheel bearing 2 is formed as a rolling bearing and comprises, in addition to a not further shown inner ring, an outer ring 6 and rolling elements 8 by which the inner ring can be rotated relative to the outer ring 6. The wheel bearing 2 is formed as a known wheel bearing of the second generation that is described, for example, in WO 2007/125 646 A1. Details on a wheel bearing of second generation can be found in that document.

Projecting radially from the outer ring 6 is a flange 10 through which is an attachment hole 12 in the axial direction. Thus, a not shown bolt can be guided axially through the attachment hole 12, by which the outer ring 6 of the wheel bearing 2 can be attached, for example, to a not-shown suspension strut of a not further shown vehicle.

The outer ring 6 has a radial step 14. First deformation sensors in the form of first strain gauges 16 are placed on the radial step 14 circumferentially around the outer ring 6. In the present construction, for example, eleven first strain gauges 16 can be placed around the outer ring 6 on the first step 14, wherein only one of these first strain gauges 16 is shown in FIG. 1. Second deformation sensors in the form of second strain gauges 18 are placed axially in front of the first step 14 circumferentially around the outer ring 6. In the present construction, for example, seven second strain gauges 18 can be placed around the outer ring 6 axially in front of the first step 14, wherein only one of these second strain gauges 18 is shown in FIG. 1.

The strain gauges 16, 18 can be used for determining mechanical loads on the rolling bearing, as is known, for example, from DE 101 64 929 B4. Details on this can be taken from the specified publication and are therefore not described in more detail.

To define the previously mentioned mechanical loads, however, it is not necessary to forward signals from the strain gauges 16, 18 to a higher-level signal processing unit. Because signals from the strain gauges 16, 18 have only very low amplitudes, it is especially necessary in a vehicle to process these signals on site at least in an intermediary way, because otherwise they could be lost in background noise.

For this reason, in the present construction, the circuit board 4 is placed on the outer ring 6, wherein this board can receive and process the signals of the strain gauges 16, 18.

The circuit board 4 comprises a cylindrical carrier plate 20 on which contact pads 22 are formed. Passage openings 23 are guided radially through the cylindrical carrier plate 20. The contact pads 22 can be electrically contacted to the strain gauges 16, 18 by bonding wires 24 that are guided through the passage openings 23. Through the use of strip conductors 26 shown in FIG. 2, the contact pads 22 and thus the electrically contacted strain gauges 16, 18 can be electrically connected to electrical modules 28 that process and/or evaluate the signals from the strain gauges 16, 18.

The cylindrical carrier plate 20 is also formed analogous to the outer ring 6 with a step 14 and supported on the outer ring 6 by three first support elements 30 that run circumferentially around the outer ring 6. Here, one of the three first support elements 30 extends from the step 14 of the cylindrical carrier plate 20 radially downward to the step 14 of the outer ring 6. The other two first support elements 30 extend in front of the step 14 of the cylindrical carrier plate 20 radially downward to the outer ring 6. Viewed in a pushing direction 32 of the cylindrical carrier plate 20 onto the outer ring 6, the three first support elements 30 are each arranged in front of the strain gauges 16, 18.

In addition to the first three support elements 30, two second support elements 34 extend radially from the cylindrical carrier plate 20 in the direction of the outer ring 6. Here, the second support elements 34 are formed shorter by a radial length 36 indicated as an example in FIG. 1 than the first support elements 30 and arranged, viewed in the pushing direction 32, behind the strain gauges 16, 18. In this way, the second support elements 34 can be moved radially past the strain gauges 16, 18 by pushing the circuit board 4 onto the outer ring 6, without contacting and possibly damaging this part. Consequently, in the event of mechanical loads, in its target position it can move radially downward by the radial length 36 in order to provide additional support for the cylindrical carrier plate 20 and to prevent mechanical stress.

The circuit board 4 further comprises a sleeve 38 that is put over the carrier plate 20 radially. The sleeve 38 is made from a metal and protects the carrier plate 20 and the electrical circuit on this plate from mechanical and electrical loads. In the present construction, the sleeve 38 is supported radially by third support elements 40 relative to the cylindrical carrier plate 20.

In the radial intermediate space 42 between the sleeve 38 and the cylindrical carrier plate 20, a silicone gel 44 can be held that can be used, for example, to stabilize the bonding wires 24. Even though the silicone gel 44 in FIG. 1 is shown only around the bonding wires 24, the silicone gel 44 could also fill up the entire intermediate space 42.

In a way that is not shown further, some support elements, for example, the second support element 34 that is arranged, in the pushing direction 32, in front of the second strain gauge 18, could also be omitted. A radial support of the carrier plate 20 could then be achieved in that, for example, the space is filled with silicone gel 44 radially between the carrier plate 20 and the outer ring 6.

Figure 2:
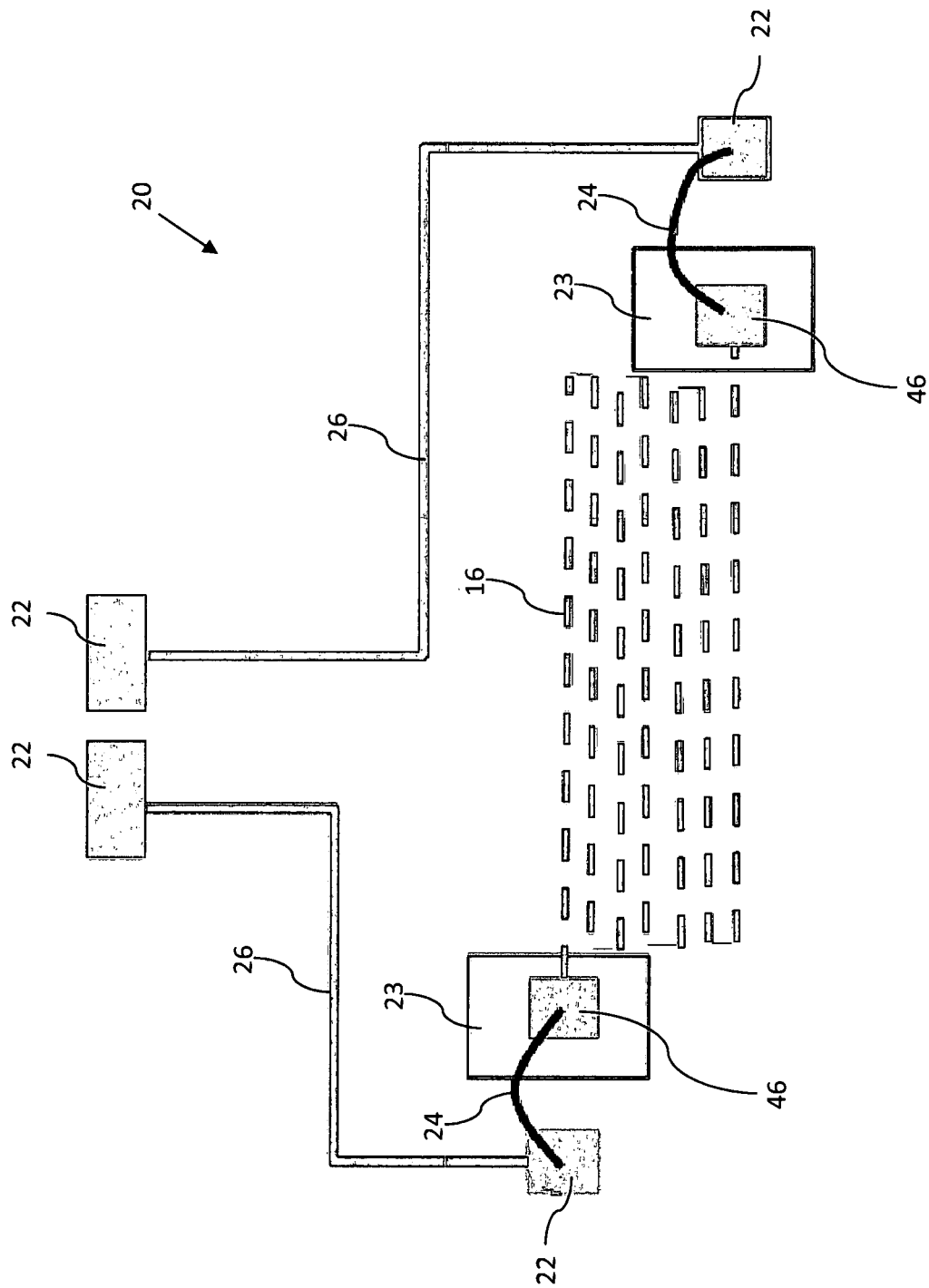
FIG. 2 shows a schematic top view of a circuit board from FIG. 1.

Refer to FIG. 2, which shows a schematic top view of the carrier plate 20 of the circuit board 4 from FIG. 1.

The difference from FIG. 1 to FIG. 2 is that the strain gauges 16, 18, which are shown, for example, with reference to one of the first strain gauges 16, are arranged essentially below the cylindrical carrier plate 20, wherein the passage openings 23 are only formed at corresponding contact points 46 at which the strain gauges 16, 18 are electrically contacted to the bonding wires 24.

In FIG. 2, contact pads 22 that are opposite the contact pads 22 connected electrically to the bonding wires 24 and at which the electrical strip conductors can be electrically contacted to the electrical modules 28 named above are formed at the ends of the electrical strip conductors.

The invention claimed is:

1. A circuit board for connecting a deformation sensor that is arranged on a radially outer side or a radially inner side of a rolling bearing outer ring or rolling bearing inner ring to a signal-processing circuit, comprising a cylindrical carrier plate with a cylinder opening in which the rolling bearing outer ring is held concentric to the cylindrical carrier plate or is arrangeable concentric to the cylinder opening on a radially outer side of the rolling bearing inner ring viewed from the cylinder opening, an electrical contact pad on the cylindrical carrier plate adapted to make electrical contact with the deformation sensor, and an electrical strip conductor that is connected electrically to the electrical contact pad receives signals from the deformation sensor and forwards the signals to the signal processing circuit.

2. The circuit board according to claim 1, further comprising at least one part of the signal-processing circuit that is carried on the carrier plate.

3. The circuit board according to claim 1, wherein the contact pad and the strip conductor are arranged on a radially outer side of the cylindrical carrier plate.

4. The circuit board according to claim 3, further comprising a radial passage opening through the cylindrical carrier plate for guiding an electrical line that electrically connects the deformation sensor to the contact pad.

5. The circuit board according to claim 1, further comprising a sleeve in which the cylindrical carrier plate is held concentrically.

6. The circuit board according to claim 1, further comprising at least two support elements on the cylindrical carrier plate that are directed radially inward toward a radially inner side of the cylindrical carrier plate.

7. The circuit board according to claim 6, further comprising a third support element on the cylindrical carrier plate that is directed radially inward toward the radially inner side of the cylindrical carrier plate and has a radially shorter construction than the two other support elements.

8. A wheel bearing for a vehicle with an inner ring that is supported by rolling elements arranged to rotate in an outer ring, a deformation sensor that arranged on a radial outer side of the outer ring, and the circuit board according to claim 1, that electrically connects the deformation sensor with the signal-processing circuit.

9. The wheel bearing according to claim 8, further comprising another deformation sensor on the radially outer side of the outer ring that is spaced apart axially from the deformation sensor and is arranged on a radial step of the outer ring opposite the deformation sensor, and the cylindrical carrier plate has a corresponding stepped construction.

10. The wheel bearing according to claim 8, wherein the outer ring has a radially outward projecting flange for mounting on a suspension strut of a vehicle on which the cylindrical carrier plate attaches in an axial direction.

* * * * *